(12) United States Patent
Dewey et al.

(10) Patent No.: US 9,709,602 B2
(45) Date of Patent: Jul. 18, 2017

(54) METHOD FOR SUPPLYING FIELDBUS COMMUNICATION AND POWER FROM A HANDHELD MAINTENANCE TOOL IN A HAZARDOUS AREA USING A SINGLE LEAD SET

(71) Applicant: FISHER-ROSEMOUNT SYSTEMS, INC., Round Rock, TX (US)

(72) Inventors: Alan Roger Dewey, Plymouth, MN (US); Alden C. Russell, III, Minnetonka, MN (US); Roger Benson, Eden Prairie, MN (US); Anthony Ferguson, Minnestrista, MN (US); Todd M. Toepke, Eden Prairie, MN (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 120 days.

(21) Appl. No.: 14/682,714

(22) Filed: Apr. 9, 2015

(65) Prior Publication Data

US 2016/0299175 A1 Oct. 13, 2016

(51) Int. Cl.
| | | |
|---|---|---|
| *G01R 1/20* | (2006.01) | |
| *G01R 1/04* | (2006.01) | |
| *H01R 31/08* | (2006.01) | |
| *H01R 105/00* | (2006.01) | |
| *G01R 31/28* | (2006.01) | |
| *H01R 13/66* | (2006.01) | |
| *H01R 13/68* | (2011.01) | |

(52) U.S. Cl.
CPC .......... *G01R 1/206* (2013.01); *G01R 1/0416* (2013.01); *H01R 31/08* (2013.01); *G01R 1/0408* (2013.01); *G01R 31/2834* (2013.01); *G01R 31/2851* (2013.01); *H01R 13/6641* (2013.01); *H01R 13/68* (2013.01); *H01R 2105/00* (2013.01)

(58) Field of Classification Search
CPC ............ G01R 31/2834; G01R 31/2851; G01R 1/0408
USPC ...................................... 324/750.01
See application file for complete search history.

(56) References Cited

U.S. PATENT DOCUMENTS

| | | | | |
|---|---|---|---|---|
| 2,325,179 A | * | 7/1943 | Doering | G01R 1/36 324/115 |
| 2,427,111 A | * | 9/1947 | Tolmie | H02M 7/62 307/132 R |
| 2,442,771 A | * | 6/1948 | Kirkpatrick, Jr. | G01R 31/02 324/511 |

(Continued)

OTHER PUBLICATIONS

Search Report issued in Great Britain Application No. 1605975.0 dated Oct. 3, 2016.

(Continued)

*Primary Examiner* — Jermele M Hollington
*Assistant Examiner* — Christopher McAndrew
(74) *Attorney, Agent, or Firm* — Marshall, Gerstein & Borun LLP (57) ABSTRACT

A connector assembly for a portable field device testing includes a two-wire communication line to provide communication between a handheld maintenance tool and a field device, a first two-prong plug to provide power and communication signals to the field device and a shunt plug to provide power to the field device using the two-wire communication line.

28 Claims, 7 Drawing Sheets

(56) References Cited

U.S. PATENT DOCUMENTS

| | | | | |
|---|---|---|---|---|
| 3,130,366 A * | 4/1964 | Draper | G01R 19/145 | 324/149 |
| 3,177,767 A * | 4/1965 | Templeman | G03B 31/06 | 353/15 |
| 3,564,372 A * | 2/1971 | Vogelsberg | H02P 25/14 | 318/434 |
| 3,668,469 A * | 6/1972 | Lee | H02H 11/001 | 361/46 |
| 4,427,851 A * | 1/1984 | Schwab | H01H 1/5805 | 200/16 D |
| 4,897,052 A * | 1/1990 | Priest | H01R 24/20 | 439/652 |
| 5,171,168 A * | 12/1992 | Chiodo | H01R 13/652 | 439/651 |
| 5,341,124 A * | 8/1994 | Leyden | G08B 13/1454 | 340/568.4 |
| 5,562,489 A * | 10/1996 | Cronin | H01L 23/60 | 361/212 |
| 5,600,255 A * | 2/1997 | Moore | G01R 27/14 | 324/537 |
| 6,089,874 A * | 7/2000 | Kroulik | H01R 35/025 | 439/11 |
| 7,309,308 B2 * | 12/2007 | Berger | F01M 13/04 | 123/572 |
| 7,510,429 B1 * | 3/2009 | Savicki, Jr. | H01R 25/003 | 174/53 |
| 7,565,253 B2 * | 7/2009 | Ewers | H04Q 9/00 | 340/870.02 |
| 8,049,361 B2 * | 11/2011 | Kielb | G05B 19/0423 | 307/36 |
| 8,344,542 B2 * | 1/2013 | Micallef | G01D 21/00 | 307/26 |
| 8,816,853 B1 * | 8/2014 | Kelsch | G08B 13/1454 | 340/568.1 |
| 2004/0039458 A1 * | 2/2004 | Mathiowetz | G05B 19/4183 | 700/17 |
| 2005/0141681 A1 * | 6/2005 | Graiger | G05B 19/409 | 379/90.01 |
| 2009/0253388 A1 * | 10/2009 | Kielb | G01D 21/00 | 455/117 |
| 2014/0056173 A1 * | 2/2014 | Nakamura | H04L 69/18 | 370/254 |

OTHER PUBLICATIONS

HTD, Jan. 28, 2010, "CBL-BN1", Home Theater Direct, Online, available from http://web.archive.org/web/20100128213055/http://www.htd.com/dual-banana-plug-CBL-BN1, access on Sep. 29, 2016.

Emerson, "475 Field Communiator User's Manual," Rev G., Apr. 2012.

Emerson 375 Field Communicator, "Product Data Sheet," May 2013.

* cited by examiner

METHOD FOR SUPPLYING FIELDBUS COMMUNICATION AND POWER FROM A HANDHELD MAINTENANCE TOOL IN A HAZARDOUS AREA USING A SINGLE LEAD SET

FIELD OF TECHNOLOGY

The present application relates to a handheld maintenance tool that selectively provides power and communication signals to a field device along a two-wire communication line while complying with Intrinsic Safety standards.

BACKGROUND

Process control systems, like those used in chemical and petroleum processes, typically include one or more process controllers communicatively coupled to at least one host or operator workstation and to one or more field devices via analog, digital, or combined analog/digital buses. The field devices, which may be, for example, valves, valve positioners, switches, and transmitters (e.g., temperature, pressure, and flow rate sensors), perform functions within the process plant, such as opening or closing valves and measuring process parameters. The process controllers receive signals of process measurements made by the field devices and/or other information pertaining to the field devices; use this information to implement control routines; and subsequently generate control signals that are sent over the buses to control the operation of the field devices. With the information collected from the field devices and process controllers, an operator or a technician can execute one or more applications at an operator workstation that perform any desired function with respect to the process, such as, for example, configuring the process, viewing the current state of the process, and/or modifying the operation of the process.

In many cases, field devices may require on-site setup, configuration, testing, and maintenance. For example, before a field device can be installed at a particular location at a process control plant, the field device may need to be programmed and may then need to be tested before and after the field device is installed. Field devices that are already installed may also need to be regularly checked for maintenance reasons or, for example, when a fault is detected and the field device needs to be diagnosed for service or repair. Generally, configuration and testing of field devices are performed on location using a handheld, portable maintenance tool. In fact, because many field devices are installed in remote, hard-to-reach locations, it is more convenient for a user to test the installed devices in such remote locations using a handheld, portable tool rather than using a full configuration and testing device, which can be heavy, bulky, and non-portable, generally requiring the installed field device to be transported to the site of the diagnostic device.

In the case where a field device is at least partially operational and supplied with power, a handheld maintenance tool or portable testing device ("PTD") can connect to a communication terminal of the field device to run a diagnostic routine. Generally, the field device and the PTD communicate over a two-wire connection. For example, a FOUNDATION® Fieldbus device uses a two-wire connection for testing and communicating with the handheld device.

In some cases, testing a field device on location may not be possible unless power is supplied to the field device. This complication occurs, for example, when there is a power outage, when there is a power issue localized to the field device itself, or when one or more field devices are offline, i.e., in fault situations. Generally, power may be provided to the field device by connecting the field device to a power source via a two-wire power line. For example, FOUNDATION® Fieldbus devices are powered via the same terminals used for communicating with the fieldbus device. However, portable power considerations and Intrinsic Safety ("IS") standards restrict the manner in which power can be provided to a field device, especially when the field device is installed in a critical or dangerous process control system in the field.

Generally, higher voltages are used for providing power to the field device than voltages used for communicating with the field device. Additionally, certain safety measures must be implemented before powering a field device in the field. In particular, according to IS guidelines, a technician cannot switch on the power of a field device within the field device itself. Accordingly, the technician servicing the field device cannot use or install a switch within the field device to switch on the power to the device from a provisioned or redundant power line. The IS guidelines prohibit internal power switching because field devices are often installed in proximity to volatile substances or volatile processes, and thus there is higher possibility of causing an explosion by arcing or generating sparks when a voltage or a power connection is applied to the field device. For reference, an internal switch may be considered any switch that is integrally connected within or physically housed within a field device and/or that is fixed to the field device.

Related IS guidelines also advise against switching on power within a PTD that is connected to a field device and that is located within a vicinity of the field device. IS standards generally require manual intervention when applying power to a non-operating or non-powered field device installed in the field. Though it may be desirable to configure existing PTDs with automatic power functions for powering a field device, this configuration is generally prohibited under the IS standards.

To comply with IS standards, some existing PTDs include an interface with four connection ports for coupling four lines or wires between the PTD and a field device undergoing testing. Generally, a first pair of lines is used for transmitting communication signals at a first voltage range and a second pair of lines is used for powering the field device at a second and higher voltage or voltage range. The first pair of lines is primarily used whenever the field device is undergoing testing, and the second pair of lines/wires is used only when power is needed to be provided to the field device to enable the field device to execute a function (e.g., a test function or a configuration function) by the field device. In this manner, additional power to the field device undergoing testing always requires manual intervention that includes connecting additional wires between the field device and the PTD. In short, IS standards have generally limited the development of portable field device testing equipment to require two separate sets of lines or lead sets and three or four ports for connecting a field device to the portable testing equipment. While it is common practice to carry two lead sets with a PTD, this activity may not be the most efficient or convenient solution for field technicians when performing maintenance functions.

SUMMARY

A method of switching on or providing power to a field device undergoing testing includes connecting a two-wire communication line between a handheld maintenance tool and the field device, where the two-wire communication line is connected to terminals of the field device at a first end and to a two-prong plug at a second end, the two-prong plug electrically coupling the two-wire communication line with the handheld maintenance tool. The two wires of the two-wire communication line are connected to a first and second prong of the two-prong plug. If no voltage is detected between the first and second prongs, a shunt plug may then be inserted to connect one of two wires of the two-wire communication line to a voltage provided by the handheld maintenance tool to thereby provide power to the field device over the same two-wire communication line. Other communication signals may then be transmitted after the shunt plug is inserted.

The DC voltage applied for powering the field device may be constant while the communication voltage may be a time-varying voltage. The shunt plug may be configured to automatically decouple from the two-wire communication line when the DC power is turned off so as to prevent inadvertently providing power to the field device upon restarting of the handheld maintenance tool.

Generally speaking, the two-wire communication line is part of an electrical connector assembly that includes a two-prong plug wherein a first and second prong are electrically connected to the two-wire communication line. The two-prong plug is configured to insert into a set of jacks or sockets of a handheld maintenance tool to be electrically coupled to the maintenance tool. The electrical connector assembly also includes a shunt plug that interfaces with the two-prong plug and interfaces with the handheld maintenance tool to connect a DC power voltage across the two-wire communication line.

In another case, a portable device assembly for communicating with a field device of a process control network includes a handheld maintenance tool and a two-wire communication line for electrically and communicatively coupling the handheld maintenance tool to the field device, wherein the two-wire communication line has a first end that is removably connected to a pair of field device terminals. The assembly also includes a two-prong plug configured to insert into a corresponding three-jack receptacle of the handheld maintenance tool where each wire of the two-wire communication line is connected to either a first or a second prong of the two-prong plug. The assembly also includes a shunt plug that includes two prongs and a circuit that electrically connects the two prongs to each other. The second prong of the shunt plug is configured to insert into the third jack of the interface and the first prong of the shunt plug is configured to insert into the two-prong plug. The two-prong plug further includes a jack receptacle for receiving the second prong of the shunt plug so that the shunt plug, when inserted into the handheld maintenance tool and the two-prong plug, electrically couples the second prong of the shunt plug and the second prong of the two-prong plug.

An electrical connector assembly for electrically and communicatively coupling the handheld maintenance tool to a field device includes a two-wire communication line that couples to the field device at a first end, a two-prong plug connected to a second end of the two-wire communication line and configured to insert into a corresponding three-jack receptacle of the handheld maintenance tool, and a removable shunt plug that couples to the handheld maintenance tool and the two-prong plug.

A two-prong plug for connecting a handheld maintenance device to a field device, the two-prong plug comprising a plug body, a first prong, a second prong, a two-wire communication line having a terminal end terminating in the plug body. A first wire at the terminal end of the two-wire communication line connects to either the first prong or the second prong, and a second wire at the terminal end of the two-wire connection line connects to the other of the first prong or the second prong. The two-prong plug also includes a one-jack receptacle that is electrically connected to either the first prong or the second prong and is adapted to receive a prong of a further plug.

DETAILED DESCRIPTION

The method and device, as described below, allow for a field device to receive power and communication signals over a reduced two-wire lead set or a two-wire communication line, while also complying with Intrinsic Safety ("IS") standards. The method and device provide many safety features and advantages over the systems currently used to communicate and supply power to field devices, and therefore a brief description of these systems will be described. Portable configuration and calibration tools often require a two-wire connection between a handheld maintenance tool or a portable testing device ("PTD") and a field device with the two-wire connection being used to provide communication between these two devices. For example, a FOUNDATION® Fieldbus device generally requires a two-wire communication line or a two-wire lead set to be connected between a PTD and the fieldbus device to set up, configure, or diagnose the field device. When the field device is already powered, the two-wire communication line is generally sufficient to complete the configuration and testing of the field device. On the other hand, it is sometimes more convenient or necessary to use a PTD that provides the necessary power during configuration or testing when the field device, such as a FOUNDATION® Fieldbus device, requires power for testing and/or configuration. IS standards, however, do not allow power to be switched on from within the PTD or from within the field device itself (e.g., when auxiliary or redundant power lines are available) because such PTDs are often used in hazardous and explosive environments.

Figures 1, 2:
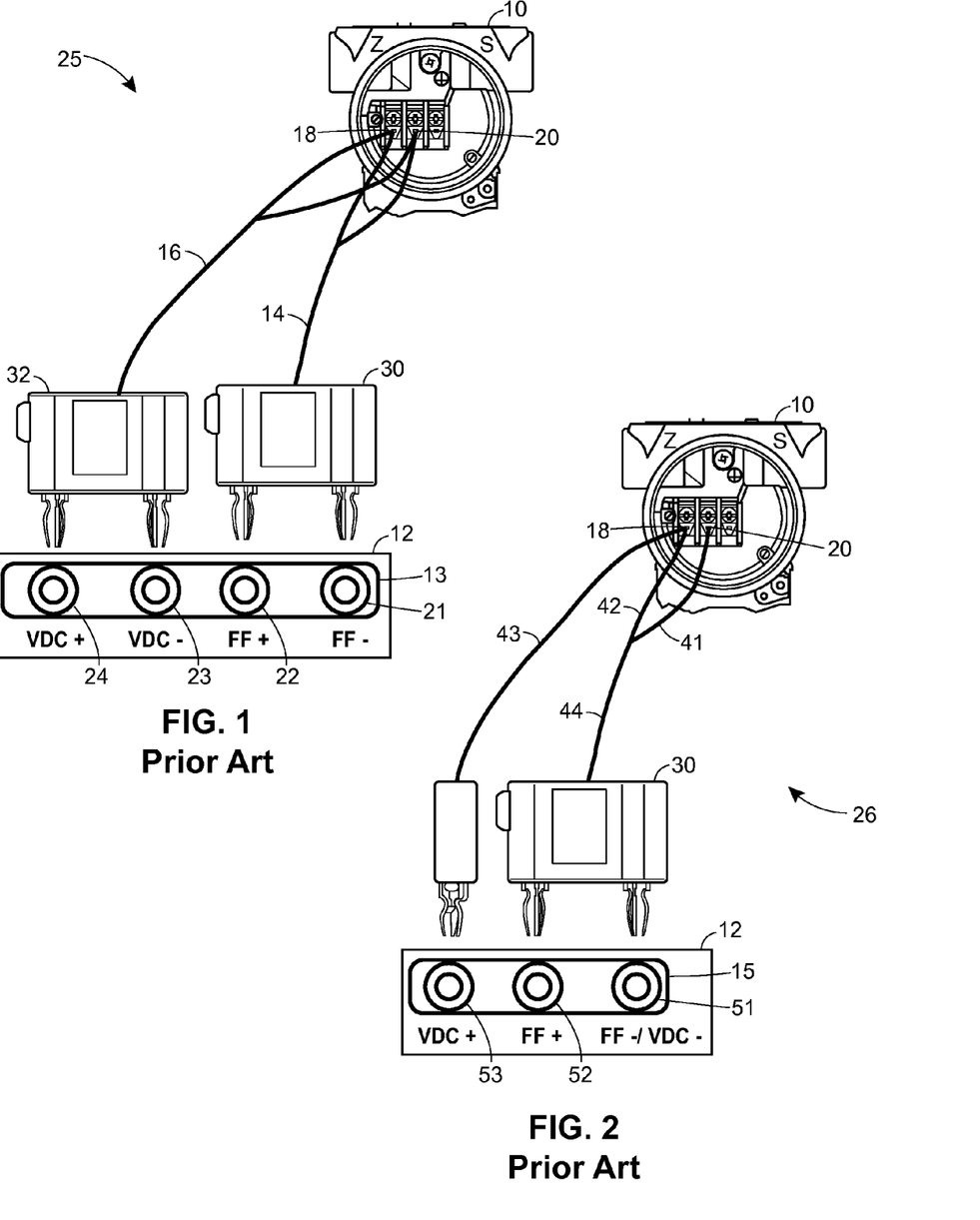
FIG. 1 illustrates an existing prior art system for supplying power and communication signals to a field device undergoing testing.
FIG. 2 illustrates a second existing prior art system for supplying power and communication signals to a field device undergoing testing.

FIG. 1 illustrates an existing system 25 including a PTD 12, which simultaneously communicates with a field device 10 and supplies power to the field device 10 under testing conditions. Generally, a first pair of wires 14 from the PTD 12 is connected to a pair of input and output terminals 18, 20 of the field device 10 to communicate with the field device 10. For example, the PTD 12 performs a diagnostic routine that extracts information from the field device 10 and/or the PTD 12 configures the field device 10 by sending program instructions to the field device 10 across the first pair of wires 14. In the existing system of FIG. 1, a technician can determine that the field device is not powered when the PTD 12 fails to obtain a reading from the field device 10. In some cases, the technician can confirm the power state of the field device 10 from a visual inspection or from an indicator on the field device 10 itself. If the field device is in a non-powered state, the technician may then connect a second pair of wires 16 between the PTD 12 and the field device 10 undergoing testing to supply power to the field device 10. Generally, the PTD 12 has an interface 13 that provides sockets, jacks, or any other type of electrical receptacle for connecting two two-prong plugs 30, 32 to the PTD 12. As used herein, a prong may refer to any kind of male connector that couples with an electrical receptacle or female connector, such as the jacks of the PTD interface 13 of FIG. 1. Each two-prong plug 30, 32 connects with one of the two-wire pairs 14, 16, respectively, wherein each wire of the pair of wires 14, 16 is connected to a separate prong of each plug 30, 32.

The interface 13 of the PTD 12 includes four jacks 21, 22, 23, 24. A first pair of jacks 21, 22 may be used for electrically coupling to the first two-prong plug 30 to provide communication signals to the field device 10. As used herein, electrically coupling two or more elements may refer to a connection that allows electricity to be conducted between the two or more elements. A second pair of jacks 23, 24 may be used for electrically coupling the second two-prong plug 32 to provide power to the field device 10 via the second pair of wires 16. General safety rules, such as IS standards, dictate that all electrical lines that carry power must be connected to the field device 10 before applying power to the electrical lines. This rule may extend to low voltage communication signals such as the communication signals transmitted along the first wire pair 14 as well as to the higher power voltages on the second wire pair 16. Any system that does not implement this directive may be contrary to the IS standards. Moreover, according to the IS standards, any power switching means must be located externally to the field device 10. The configuration of FIG. 1 complies with existing IS standards because the power cannot be switched on within the field device 10 itself. Additionally, the configuration of FIG. 1 allows for a user to manually connect the terminals 18, 20 of the connector assembly to the field device 10 before connecting the plugs 30, 32 to the corresponding jacks 21, 22, 23, 24 of the PTD interface 13.

FIG. 2 illustrates a typical portable testing system 26 in which three wires or lines 41, 42, 43 (reduced from four lines in the system of FIG. 1) are used to connect the PTD 12 to the field device 10. The PTD 12 has an electrical connection interface 15 including first, second, and third jacks 51, 52, 53 that correspond to the three lines 41, 42, 43. The interface 15 includes the first jack 51 that may be used as a common or a ground line for both a communication signal FF+ (e.g., a FOUNDATION® Fieldbus communication signal) on the second jack 52 and a power voltage VDC+ on the third jack 53.

As illustrated in FIG. 2, the input and output terminals 18, 20 of the field device 10 are connected via a first set of wires 44 (including wires 41, 42) to the first and second jacks 51, 52, respectively, of the PTD interface 15. A second wire set 43 (including one wire 43 and the common 41) provides the power voltage VDC+ across the terminals 18, 20 for powering the field device 10 as needed. The system 26 reduces the configuration hardware needed for setting up the PTD 12 by one terminal connection to the field device 10. Thus, while the system 25 of FIG. 1 requires a technician to connect the first and the second wires of the first wire pair 14 to the terminals 18, 20 and to connect the first and the second wires of the second wire pair 16 to the same terminals 18, 20, the system 26 of FIG. 2 only requires the technician to connect one additional wire 43 to the field device 10 when power is required. Unfortunately, the system 26 still requires the technician to carry two sets of connection lines, including the first set 44 having two wires 41, 42 and the second set 43 having one wire.

Figure 3:
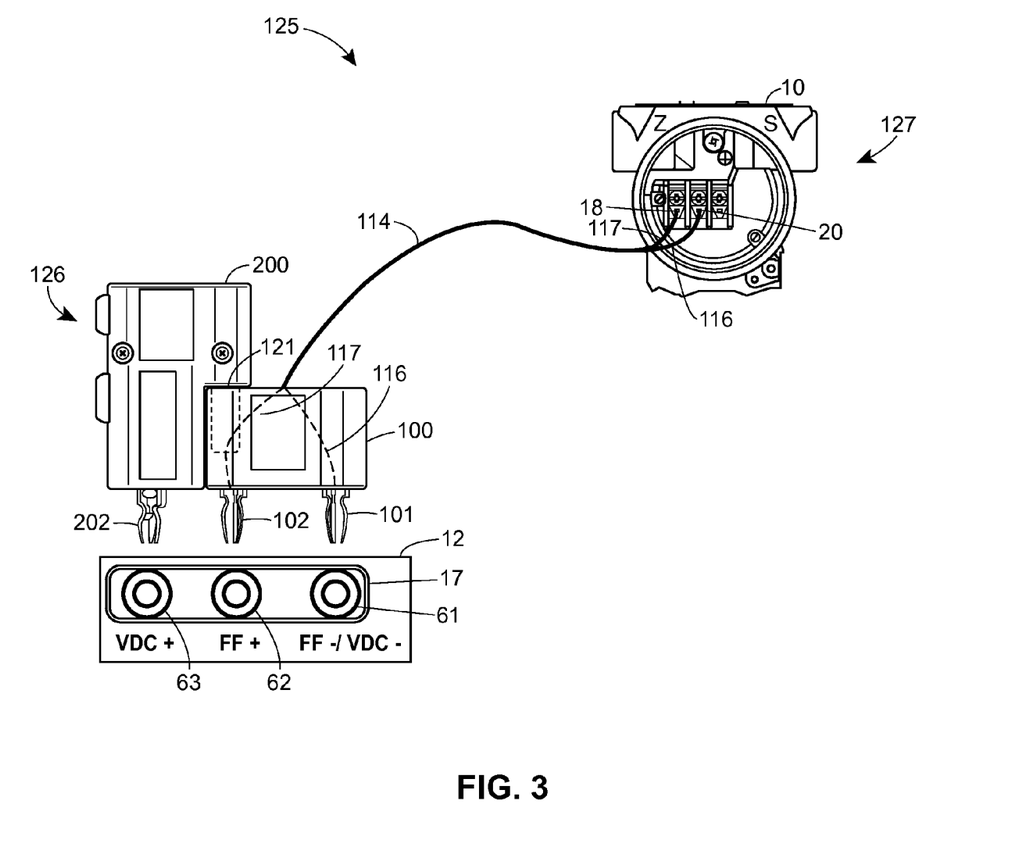
FIG. 3 illustrates a testing system including an electrical connector assembly using a shunt plug and a two-prong plug for supplying power and communication signals to a field device undergoing testing using a two-wire communication line.

FIG. 3 illustrates a testing assembly 125 using a two-wire communication line electrical connector assembly 126 to provide communication signals between the field device 10 and the PTD 12 while additionally providing auxiliary power to the field device 10 when needed. The PTD 12 of FIG. 3 includes an interface 17 for providing communication signals to the field device 10 and for supplying power to the field device 10, as required. In particular, the interface 17 includes first, second, and third jacks 61, 62, 63 for providing communication and power to the field device 10. In this case, the first jack 61 is a common or ground line, the second jack 62 provides a communication signal voltage FF+, and the third jack 63 provides a power voltage VDC+ for powering the field device 10. As a result, the PTD or handheld maintenance tool 12 of FIG. 3 may be similar to or the same as the PTD of FIG. 2.

Figure 4:
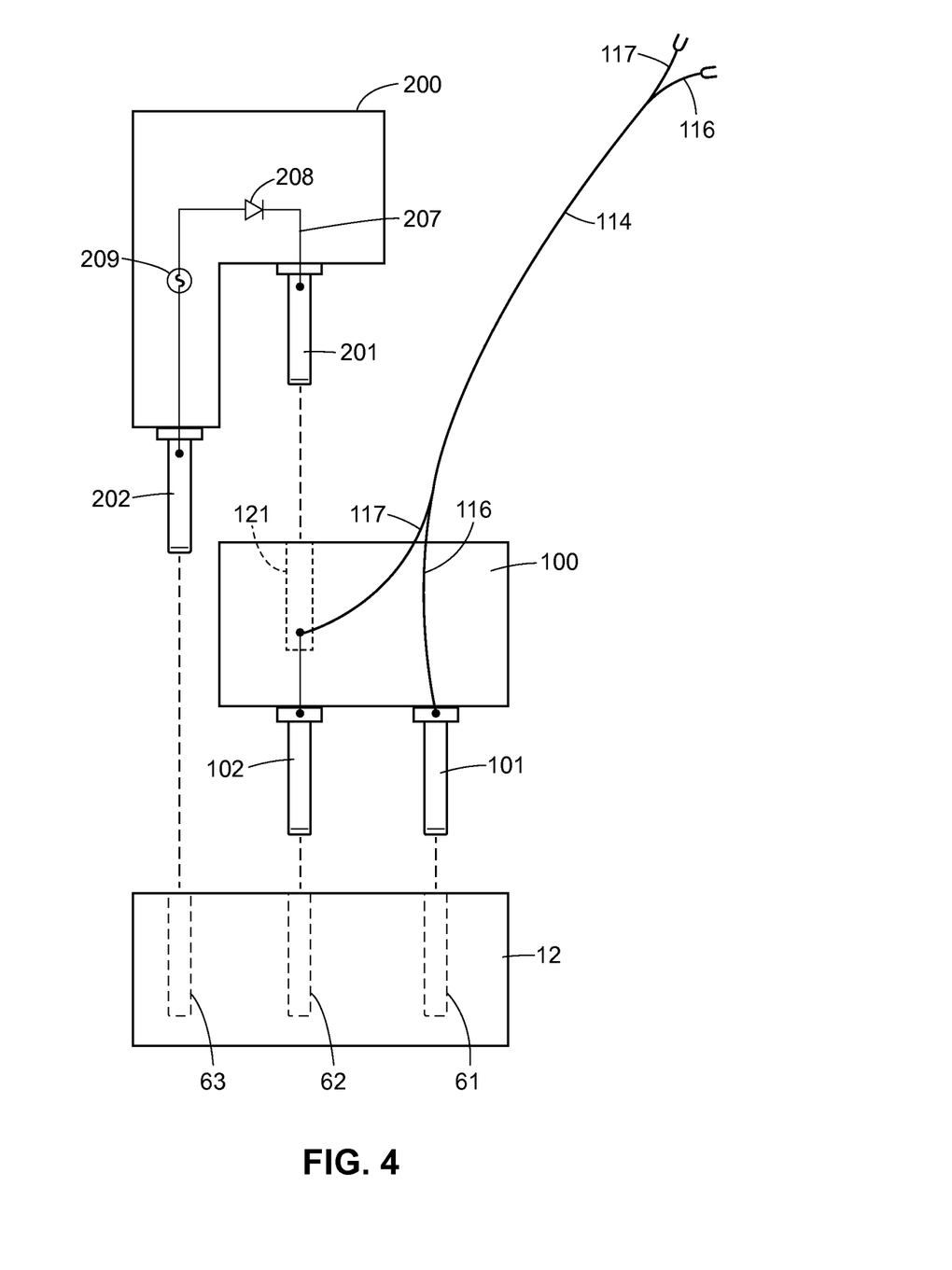
FIG. 4 illustrates an exploded side view of the two-prong plug and shunt plug of the assembly of FIG. 3 aligned with a handheld maintenance tool.

A two-prong plug 100 and a shunt plug 200 of the two-wire communication line connector assembly 126 are configured to mate with the interface 17 of the PTD 12 as illustrated in FIG. 3 and the exploded view of FIG. 4. In particular, a first prong 101 and a second prong 102 of the two-prong plug 100 are adapted to mate with the corresponding first and second jacks 61, 62, respectively, of the PTD interface 17. A two-wire line 114, which connects the PTD 12 and the field device 10, terminates at a first end of the plug 100. As better illustrated in FIG. 4, a first wire 116 of the two-wire line 114 electrically couples to the first prong 101 of the plug 100 and a second wire 117 of the two-wire line 114 electrically couples to the second prong 102 of the plug 100. Referring back to FIG. 3, the two-wire line 114 terminates at a second end in which the wire 116 electrically couples to the terminal 20 of the field device 10 and the wire 117 electrically couples to the terminal 18 of the field device 10. As noted above, IS standards limit the type of connections that can be made to the field device 10 to those connections that are temporary, removable, and not integral with the field device 10. In some cases, the field device 10 may have standard screw-in connectors to connect with the two-wire line 114. However, the two-wire line 114 may terminate at the second end in any other structure, plug, lug, or connector.

In the connector assembly 126 illustrated in FIG. 3, the two-prong plug 100 is not connected directly to the power supply VDC+ of the third jack 63 of the interface 17. Instead, as illustrated in FIGS. 3-4, the two-prong plug 100 has a one-jack receptacle 121 that is electrically coupled to the second prong 102 and, therefore, is electrically coupled to the wire 117 and the second jack 62 of the interface 17 when the plug 100 is inserted into the PTD 12. However, the shunt plug 200 operates to connect the power supply VDC+ to the wire 117 of the plug 100. In particular, FIG. 4 illustrates the shunt plug 200 of the connector assembly 126 having a first and second prong 201, 202 and a shunt circuit 207 that electrically couples the two prongs 201, 202 together. The prongs 201, 202 are configured to electrically couple to the two-prong plug 100 via the jack receptacle 121 and to the PTD 12 via the third jack 63 of the interface 17, respectively. When the shunt plug 200 is inserted into the two-prong plug 100 and into the interface 17, the second prong 102 of the plug 100 and the second prong 202 of the shunt plug 200 are electrically coupled together because the shunt circuit 207 couples the two prongs 201, 202 together, thereby electrically coupling the second and third jacks 62, 63 with the wire 117 of the two-wire line 114. In this coupling, both a first voltage VDC+ applied from the second jack 62 and a communication signal voltage FF− from the first jack 61 can be applied across the field device terminals 18, 20 using only the two-wire communication line 114.

The electrical connector assembly 126 of FIG. 3 provides many advantages over the existing systems of FIGS. 1 and 2. For example, the assembly 126 eliminates the need for two two-wire connection lines to test a field device 10 using a PTD 12. Instead of requiring two sets of connection lines, as required for the prior art systems, a technician only needs to carry one set of connection lines. Additionally, the connector assembly 126 helps prevent accidental application of power to the field device 10. For example, one safety feature of the assembly 126 is the L-shaped body of the shunt plug 200. As better illustrated in the exploded view of FIG. 4, the prongs 201, 202 of the shunt plug 200 are not coplanar, and the body of the shunt plug 200 is L-shaped to mate with the corner of the two-prong plug 100 when the shunt plug 200 is inserted into the jack 121 of the plug 100 and inserted into the third jack 63 of the interface 17. As seen in FIGS. 3-4, the distance between the first and second prongs 101, 102 of the plug 100 is greater than both the distance between the first and second prongs 201, 202 of the shunt plug 200 and the distance between the second prong 102 of the plug 100 and the second prong 202 of the shunt plug 200. The layout of the interface 17 and the spacing of the prongs of the shunt plug 200 and the two-prong plug 100 help prevent a user from mistakenly applying power or shorting the PTD 12. For example, a user may not insert the two-prong plug 100 into the second and third jacks 62, 63 of the interface 17, and thus may not apply power to the two-wire communication line 114, because the distance between the two prongs 101, 102 and the distance between the second and third jacks 62, 63 are different. Additionally, the user cannot accidentally apply power to the two-wire communication 114 line without inserting the shunt plug 200 because the PTD 12 is configured to require manual operation in order to supply power, as discussed further below.

The shunt plug 200 may also include additional features that can increase operational safety when using the PTD 12. In one case, the shunt 200 plug includes a diode 208 as part of the shunt circuit 207 that connects the two prongs 201, 202 of the shunt plug 200. With the diode 208, the shunt plug 200 blocks any reverse currents on the two-wire line 114 that may affect or damage the PTD 12. In a second case, the shunt plug 200 may include a fuse 209, which may be an intrinsically safe fuse if so desired, in line with the prongs 201, 202 to provide overload protection. This configuration is useful in case the field device 10 has a short, for example.

Figure 5:
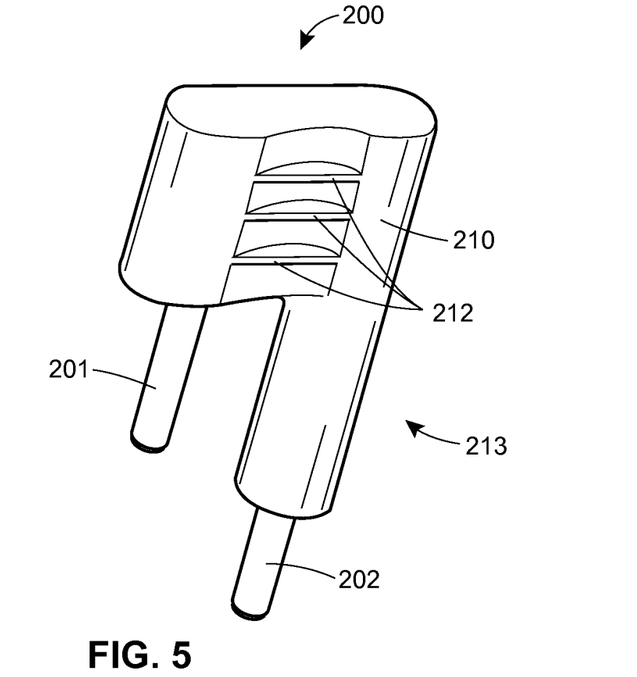
FIG. 5 illustrates a perspective view of an exemplary side of the shunt plug of the assembly of FIG. 3.
Figure 6:
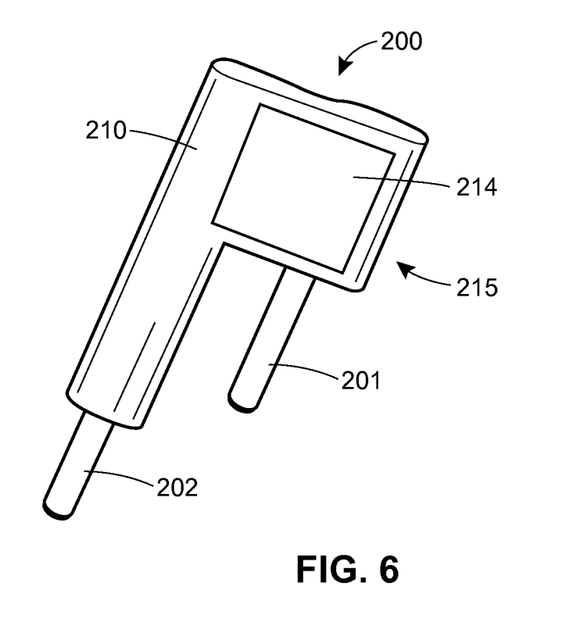
FIG. 6 illustrates a perspective view of a second exemplary side of the shunt plug of the assembly of FIG. 3.

FIGS. 5 and 6 illustrate the mechanisms of the shunt plug 200 that may further facilitate manual operation. In FIG. 5, the body 210 of the shunt plug 200 may be configured to help a user remove the shunt plug 200 while the user is working on-site. A first side 213 of the body 210 of the shunt plug 200 includes plastic ribs 212 or indentations that provide a textured surface of the shunt plug 200 to improve a user's grip on the shunt plug 200. For example, in the case where the user has to wear protective gloves, the plastic ribs 212 allow the user to securely grab and remove the shunt plug 200 from the PTD 12 and two-prong plug 100. Referring now to FIG. 6, a second side 215 of the body 210 of the shunt plug 200 may include a flat, recessed area 214 for label placement. The recessed area 214 of the body 210 helps prevent a label from peeling off the body 210 of the shunt plug 200. The label affixed to the recessed area 214 may identify the shunt plug 200 itself and/or it may display warnings or instructions for using the shunt plug 200.

The shunt plug 200 may also include additional mechanisms to ensure manual intervention whenever power is needed for the field device 10. The shunt plug 200 may be designed to include a combination of mechanisms (e.g., mechanical, electrical, or magnetic) to promote manual intervention, required by IS standards, when switching on power to a field device 10. As discussed above, there is a possibility that by keeping the shunt plug 200 inserted into the two-prong plug 100 when testing is complete, there is an increased risk of accidentally applying power to the field device 10 the next time the two-wire lead set 114 is connected to a new field device. To prevent this occurrence, one mechanism of the shunt plug 200, such as a one-way power switch, causes the shunt circuit 207 to open when the power is removed from the two-wire communication line 114 and causes the shunt plug 200 to remain open until a user manually removes and re-inserts the shunt plug 200. In one case, the PTD 12 may include a software module 193 (illustrated in FIG. 10) that is programmed to electrically decouple the voltage provided to the shunt plug 200 from the two-prong plug 100 and the PTD 12 when power is removed from the PTD 12. The software module 193 of the PTD 12 is configured to detect a load, or a current, between the first and second jack 61, 62 (illustrated in FIG. 3) of the PTD 12. If the PTD 12 does not detect a load between the first and second jack 61, 62, the PTD 12 may determine that the PTD 12 is not connected to, or communicating with, the field device 10, and then may open the power connection to the third jack 63 of the PTD 12. The third jack 63 remains in an open position, i.e. no current flowing to the jack, until a user reconnects the first and second wires 116, 117 of the two-wire communication line 114 to another field device, and reinitiates the power connection using the software module 193. A manual reset of the electrical connector assembly 126 may be implemented by removing the shunt plug 200 from the two-prong plug 100 and the PTD 12 (at which point the software module 193 detects an open circuit to the third jack 63). In another case, a manual reset may be implemented by first removing and then reinserting the shunt plug 200 into the two-prong plug 100 and the PTD 12. Thus, using either of these mechanisms of the PTD 12 is beneficial because the PTD 12 is programmed to automatically disconnect the power supply and will not reapply a power voltage until the user makes a conscious attempt to supply power again. These mechanisms reduce the ability of the user to supply power by mistake.

From a purely functional standpoint, an exemplary shunt plug may have a different shape. The shunt plug 200 illustrated here, on the other hand, has an alternative, ornamental arrangement for the L-shaped body of the shunt plug 200. This illustrated arrangement may add to the cost of manufacture, so the illustrated shunt plug 200 may not provide all of the possible economic advantages that might be derived from the invention. On the other hand, this arrangement is believed to be aesthetically pleasing and may be recognized and relied upon by purchasers to identify the source of the shunt plug.

Figure 7:
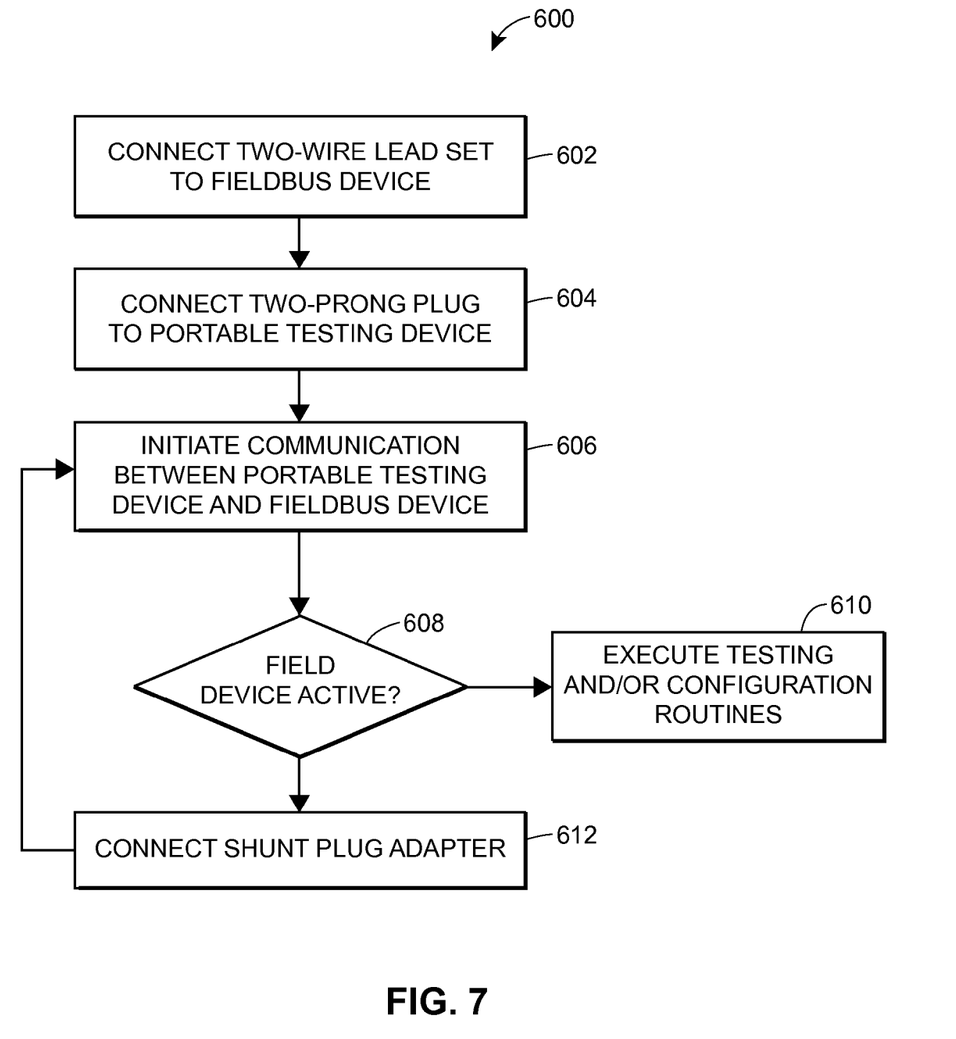
FIG. 7 is a flow chart of a method of switching on power to the field device undergoing testing from a handheld maintenance tool using the plugs of FIG. 4 in a manner that conforms to IS standards.

FIG. 7 illustrates a flow chart of a method of selectively supplying power to the field device 10 undergoing testing using the assembly 126 of FIG. 3 while complying to IS standards. At a block 602, the two-wire communication line 114 is connected to the field device 10 undergoing testing. As discussed above, to reduce the risk of arcing or producing a spark during a connection of any voltage across the two-wire communication line 114, the two-wire communication line 114 must first connect to the field device 10 before the communication line 114 connects to a potential power source. At a block 604, the two-wire connection line 114 is connected to the PTD 12 by plugging the two-prong plug 100 (which serves as a terminal end for the lead set) into the interface 17 of the PTD 12. At a block 606, a processor 190 (illustrated in FIG. 10) of the PTD 12 may initiate a communication between the PTD 12 and the field device 10, for example, when the PTD 12 either receives a communication signal from the field device 10, or detects a voltage on the two-wire communication line 114. This communication may include a measurement (e.g., impedance or current) of the two-wire communication line 114. The communication may also include a signal prompting the field device 10 to reply (e.g., a ping). In some cases, the communication signal applied across the two-wire communication line 114 may be a time-varying voltage signal, while in other cases, the communication signal may be a modulated DC voltage. The processor 190 at a block 608 may determine whether the field device 10 is active or powered depending on the measurement of the voltage on the two-wire communication line 114 as detected by the block 606. For example, the processor 190 at block 608 may determine that the impedance or current is such that the field device 10 is powered and/or can execute a configuration function (including performing further communications). If the field device 10 is powered and can receive communications, the processor 190 at a block 610 executes testing and/or configuration routines or functions via the two-wire communication line 114. If the field device 10 is not powered, the processor 190 at a block 612 may prompt the user (via the PTD 12) to connect or insert the shunt plug 200 into the interface 17 and the jack 121 of the two-prong plug 100 to apply a powering voltage across the two-wire communication line 114. The routine 600 may then return to the block 606 to initiate communication with the field device 10. If the processor 190 at block 608 determines that the field device 10 is active and the communication is successful, the processor 190 at block 610 may then execute testing and/or configuration routines via the two-wire communication line 114.

The processor 190 at block 610 may determine when the program execution is complete. For example, the processor 190 at block 610 can determine that it has finished processing all the commands given to it by a user. The processor 190 at block 610 may then display that the operation(s) is complete and further prompt the user to disconnect the shunt plug 200 from the PTD 12 and the two-prong plug 100. To meet IS standards, the user should decouple the shunt plug 200 from the two-prong plug 100 and PTD 12 to switch off the power from the field device 10 while standing an appropriate distance from the field device 10. This operation reduces the risk of initiating arcing near the field device 10, which might happen if the two-wire communication line 114 was first disconnected at the field device terminals 18, 20. Prompting the user to disengage the shunt plug 200 also reduces future risk of connecting the two-wire line 114 to a different field device while being connected to the powering voltage.

Figure 8:
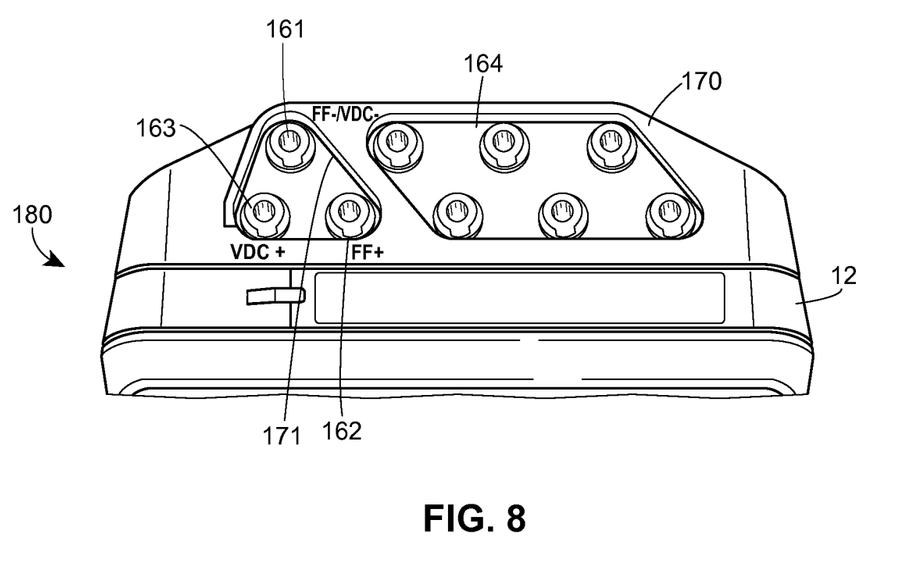
FIG. 8 illustrates a top view of a handheld maintenance tool configured to be used with the electrical connector assembly of FIG. 3.
Figure 9:
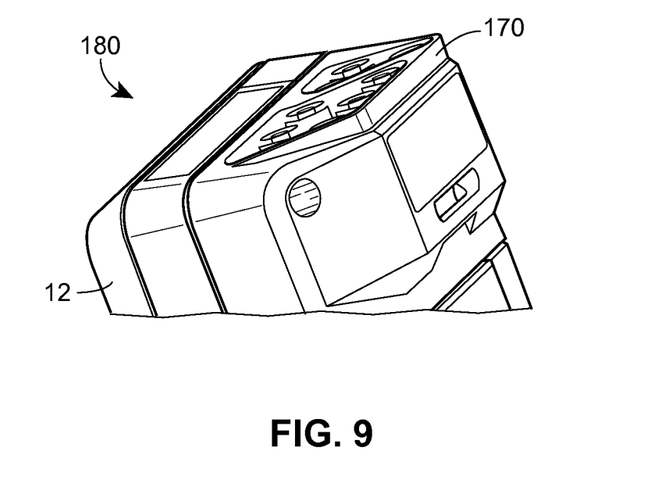
FIG. 9 illustrates a perspective view of the top of the handheld maintenance tool of FIG. 8.
Figure 10:
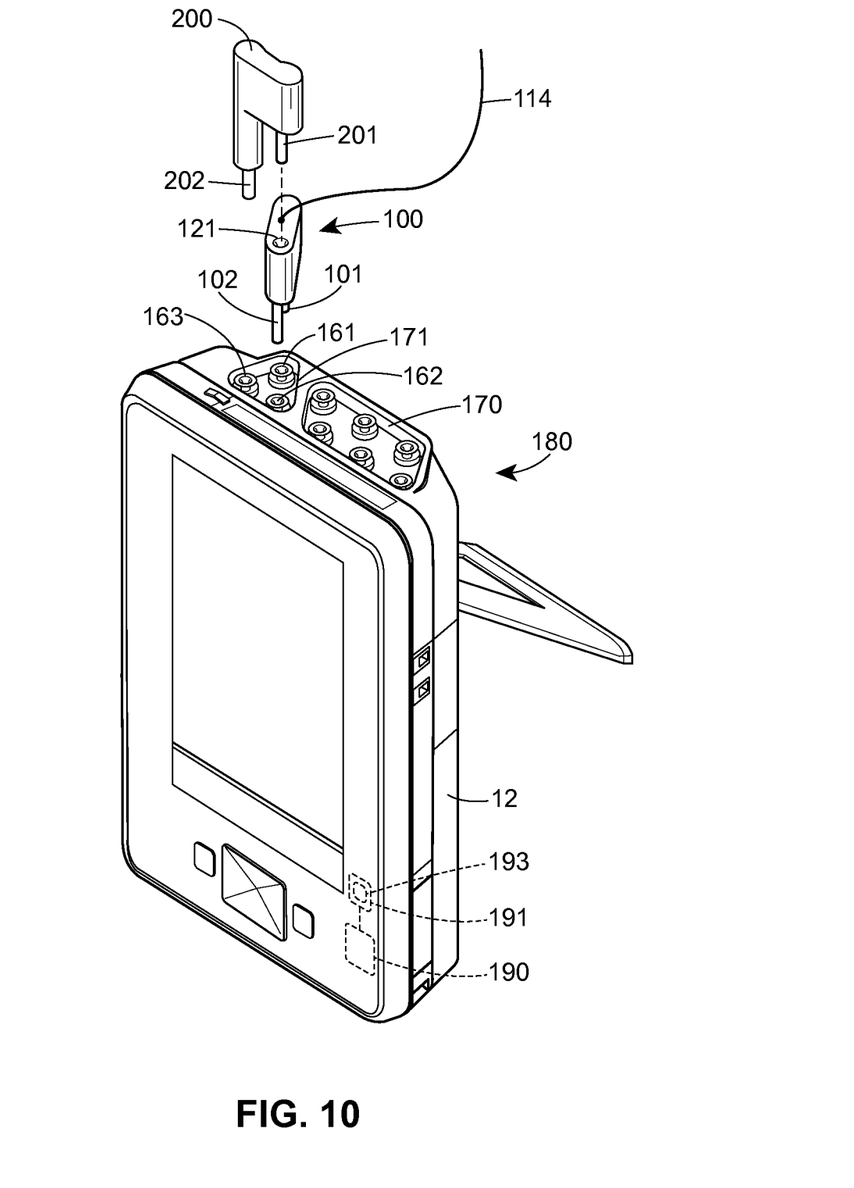
FIG. 10 illustrates an exploded, perspective view of a two-wire communication line configuration of FIG. 3, including the two-prong plug and the shunt plug of FIG. 4, aligned with the handheld maintenance tool of FIGS. 8 and 9.

The handheld maintenance tool or PTD 12 of FIGS. 8-10 is conveniently designed to (1) communicatively and electrically couple to different types of field devices, (2) protect the connections at the PTD interface, and (3) provide an interface having a logical and fail-safe layout. The PTD 12 in FIGS. 8-10 is configured to perform testing or configuration routines with more than one type of field device, for example a HART Communication Protocol field device or a FOUNDATION® Fieldbus device. A top 180 of the PTD 12 allows the PTD 12 to connect with different field devices by providing a first interface 164 that corresponds to one type of field device and a second interface 171 that corresponds to a second field device, as best illustrated in FIG. 8. For example, the top 180 of the PTD 12 has two groupings of jacks, or interfaces, 164, 171 for communicating with both a HART Communication Protocol field device and a FOUNDATION® Fieldbus field device, respectively. A first, second, and third jack 161, 162, 163 of the interface 171 are configured to receive the two-wire communication line connector assembly 126 of FIG. 3. As a result, the PTD in FIGS. 8-10 can replace the PTD of FIG. 3.

However, in the configuration of FIGS. 8-10, instead of having a linear placement of three jacks like the interface 17 of FIG. 3, the interface 171 of the PTD 12 has a triangular and slanted placement of three jacks. The interface 164 has a trapezoidal placement of at least six jacks. Similar to the jacks 61, 62, 63 of the interface 17 of FIG. 3, the three jacks 161, 162, 163 of the interface 171 respectively correspond to a ground or common line FF−/VDC−, a communication voltage FF+, and a power supply VDC+. The first jack 161 is spaced apart from the second jack 162 at a distance that is greater than a distance between the second jack 162 and the third jack 163. The distances between the jacks 161, 162, 163 correspond to the distance between the prongs 101, 102 of the two-prong plug 100 and the distance between the second prong 102 of the two-prong plug 100 and the second prong 202 of the shunt plug 200, respectively. Further, the shape of the body of the two-prong plug 100 and the shape of the body of the shunt plug 200 may be configured specifically to mate only when the connector assembly 126 aligns with the triangular placement of the interface 171 of the PTD 12. For example, the body of the two-prong plug 100 may be shaped to receive the L-shaped body of the shunt plug 200 only when the two-prong plug 100 and the shunt plug 200 are aligned with the triangular interface 171 of the PTD 12.

As illustrated in FIG. 9, the top 180 of the PTD 12 has a protective ridge 170 that shields the jacks of the interfaces 164, 171 of the PTD 12. FIG. 9 is a perspective view of the top 180 of the PTD 12 and better illustrates the protective ridge 170 and the slanted placement of the jacks of the interfaces 164, 171. The ridge 170, an angled projection integrally formed with the top 180 of the PTD 12, provides a protective barrier for the jacks at the back edge of the top 180. FIG. 9 also illustrates the slanted placement of the jacks and how the jacks project from the top 180 of the PTD 12 at an angle, but are embedded so that the jacks do not protrude beyond the protective ridge 170. FIG. 10 is an exploded view of the PTD 12 and the two-wire communication connector assembly 126 aligned with the interface 171 at the top 180 of the PTD 12. FIG. 10 also illustrates the processor 190 connected to a memory 191 which stores codes and programming instructions to enable the PTD 12 to perform the functions discussed above, as well as other functions including testing, communication, configuration, and programming instructions that are normally performed by a PTD 12. The software module 193, located within the memory 191, implements one such function that is discussed above.

The PTD 12 described above may be programmed or otherwise configured to apply the DC power voltage to the third jack 63 of FIG. 3 or the third jack 163 of FIGS. 8-10, as long as the field device 10 is active and has power. For example, the PTD 12 may be configured without a power switch, which is compliant with IS standards because generally, a power switch of the PTD 12 may be in an unknown power state and the power may be accidentally applied at the wrong time.

The PTD 12 illustrated in FIGS. 8-10 and discussed above provides convenient and fail-safe design features. For example, the top 180 of the PTD 12 is configured to receive different types of field device connection lines. An additional convenient feature of the PTD 12 is the location of the interfaces 164, 171 at the top 180 of the PTD 12. Connecting field device connection lines to the top 180 of the PTD 12 is more convenient for a technician while on site because the technician can see the face of the PTD 12 better and because the connection lines do not interfere with the technician's mobility. Additionally, the angled placement of the interfaces 164, 171 at the top 180 of the PTD 12 provides better visibility of the connections. For example, instead of flipping or rotating the PTD 12 to connect the PTD 12 to the field device 10, the technician can hold the PTD 12 in place and connect the connection lines accurately without tilting the PTD 12. The ridge 170 of the top 180 of the PTD 12 provides a protective barrier to the connection lines in case the PTD 12 is dropped. Finally, the placement of the jacks, as described above, prevents accidental misuse of the connector assembly 126 of FIG. 3 when connecting the PTD 12 to the field device 10. The triangular layout of the interface 171 and the spacing of the prongs of the shunt plug 200 and the two-prong plug 100 prevent a user from mistakenly supplying power or shorting the PTD 12. For example, the user cannot insert the two-prong plug 100 into the second and third jacks 162, 163 of the interface 171 because the distance between the two prongs 101, 102 and the distance between the second and third jacks 162, 163 are different and the prongs 101, 102 do not align with the jacks 162, 163. Moreover, the user must connect the two-prong plug 100 to the PTD 12 prior to connecting the shunt plug 200, which supplies power to the field device 10.

From a purely functional standpoint, an exemplary top and overall structure of the PTD might simply include a different jack arrangement and/or overall shape of the device itself. The PTD 12 illustrated in FIGS. 8-10, on the other hand, has an alternative, ornamental arrangement for the placement of the jacks and angular orientation of the interface of the top 180 of the PTD 12. This illustrated arrangement adds to the cost of manufacture, so the illustrated PTD 12 may not provide all of the possible economic advantages that might be derived from the invention. On the other hand, this arrangement is believed to be aesthetically pleasing and may be recognized and relied upon by purchasers to identify the source of the PTD.

Although the forgoing text sets forth a detailed description of numerous different embodiments, it should be understood that the scope of the patent is defined by the words of the claims set forth at the end of this paper. The detailed description is to be construed as exemplary only and does not describe every possible embodiment. Further, while a FOUNDATION® Fieldbus field device connection and has been referenced, the described assembly and devices may be used on other process control systems and field device types. Numerous alternative embodiments could be implemented, using either current technology or technology developed after the filing date of this paper, which would still fall within the scope of the claims.

Thus, many modifications and variations may be made in the techniques and structures described and illustrated herein without departing from the spirit and scope of the present claims. Accordingly, it should be understood that the methods and apparatus described herein are illustrative only and are not limiting upon the scope of the claims.

What is claimed is:

1. A method of switching power to a field device under testing conditions using a two-prong plug with first and second prongs, a shunt plug, and a two-wire communication line having a first terminal pair of wires at a first end connectable to the field device and removable therefrom and a second terminal pair of wires at a second end that terminates at the two-prong plug and a first wire of the second pair is connected to one of the first and second prong and a second wire connected to the other of the first and second prong of the two-prong plug, the method comprising:
    connecting the two-wire communication line between a handheld maintenance tool and the field device to electrically couple the two-wire communication line with the handheld maintenance tool; and
    inserting the shunt plug having a first prong and a second prong into the handheld maintenance tool and into the two-prong plug, such that the second prong of the shunt plug is inserted into a power jack of the handheld maintenance tool so that the shunt plug connects the second prong of the two-prong plug and the second prong of the shunt plug to apply a voltage of the handheld maintenance tool across the two-wire communication line to power the field device.

2. The method of claim 1, including measuring a voltage on the two-wire communication line before the shunt plug is inserted into the handheld maintenance tool and applying a power voltage on the two-wire communication line between the handheld maintenance tool and the field device after the shunt plug is inserted into the handheld maintenance tool and the two-prong plug.

3. The method of claim 1, including electrically connecting the first and second prongs of the shunt plug with the second prong of the two-prong plug via a circuit of the shunt plug that electrically connects the first and the second prongs of the shunt plug.

4. The method of claim 3, wherein inserting the shunt plug comprises electrically connecting the first prong of the shunt plug to one of a one-jack receptacle of the two-prong plug and a predetermined jack receptacle of the handheld maintenance tool and electrically connecting the second prong of the shunt plug to the other of the one-jack receptacle and the predetermined jack receptacle of the handheld maintenance tool.

5. The method of claim 1, further including operating the handheld maintenance tool to provide a time-varying signal voltage across a first jack and a second jack and to provide a constant power voltage to a third jack that is higher in voltage than the signal voltage.

6. The method of claim 1, further including receiving an indicator from the handheld maintenance tool that the field device is unpowered and prompting a user to insert the shunt plug into the handheld maintenance tool and the two-prong plug into the handheld maintenance tool and the two-prong plug.

7. The method of claim 1, including operating the handheld maintenance tool to apply the voltage to a third jack of the handheld maintenance tool when the handheld maintenance tool has power.

8. The method of claim 1, including automatically decoupling the shunt plug from the two-wire communication power line when the voltage is turned off from the two-wire communication line.

9. The method of claim 8, further including implementing a manual reset by removing the shunt plug from the two-prong plug and the handheld maintenance device and re-inserting the shunt plug into the two-prong plug and the handheld maintenance device after the shunt plug decouples from the two-wire communication power line.

10. The method of claim 1, further including providing a DC voltage for powering the field device and a signal voltage for communicating with the field device across the two-wire communication line after inserting the shunt plug.

11. An electrical connector assembly for selectively coupling a power voltage to a communication line comprising:
a two-prong plug including a first prong, a second prong, and a one-jack receptacle;
a two-wire communication line including a first terminal pair of wires of a first end of the two-wire communication line and a second terminal pair of wires of a second end of the two-wire communication line;
a shunt plug including a first and a second prong and a circuit that electrically connects the first and second prongs to each other,
wherein the first terminal pair of the first end of the two-wire communication line is connectable to a pair of terminals of a field device and removable therefrom, and the second terminal pair of the second end terminates at the two-prong plug wherein a first wire of the second terminal end is connected to one of the first prong and the second prong of the two-prong plug and a second wire of the second terminal end is connected to the other of the first prong and the second prong of the two-prong plug;
wherein the two-prong plug is configured to insert into a first jack and a second jack of a three jack receptacle of a handheld maintenance tool; and
wherein the one-jack receptacle of the two-prong plug is electrically coupled to the second prong of the two-prong plug and the second prong of the shunt plug when the shunt plug is inserted into the two-prong plug.

12. The electrical connector assembly of claim 11, wherein the shunt plug is configured to insert into the two-prong plug and a third jack of the three jack receptacle of the handheld maintenance device in a single orientation with respect to the two-prong plug.

13. The electrical connector assembly of claim 12, wherein the shunt plug further includes a diode as part of the circuit to block a reverse current.

14. The electrical connector assembly of claim 12, wherein the shunt plug and the two-prong plug are linearly oriented to align with a linear three jack receptacle of a handheld maintenance device.

15. The electrical connector assembly of claim 12, wherein the shunt plug and the two-prong plug are arranged in a triangular orientation to align with a three jack receptacle of a handheld maintenance.

16. The electrical connector assembly of claim 11, wherein the two-wire communication line is adapted to carry a power sufficient to power at least two field devices within intrinsic safety guidelines.

17. The electrical connector assembly of claim 11, wherein the shunt plug further comprises a body, wherein the body includes ribs.

18. The electrical connector assembly of claim 11, wherein the shunt plug further comprises a body, and wherein the body includes a recessed area.

19. The electrical connector assembly of claim 18, wherein the recessed area of the body of the shunt plug is flat.

20. A portable device assembly for communicating with a field device of a process control network, the assembly comprising:
a handheld maintenance tool including a three jack receptacle;
a two-prong plug including a first prong, a second prong, and a one-jack receptacle;
a shunt plug that includes a first prong, a second prong, and a circuit that electrically connects the first prong and second prong to each other;
a two-wire communication line including a first terminal pair of wires of a first end of the two-wire communication line and a second terminal pair of wires of a second end of the two-wire communication line, the two-wire communication line electrically and communicatively coupling the handheld maintenance tool to the field device;
wherein the first terminal pair of wires of the first end of the two-wire communication line is connectable to a pair of terminals of a field device and removable therefrom, and the second terminal pair of wires of the second end terminates at the two-prong plug wherein a first wire of the second terminal pair of wires is connected to one of the first prong and the second prong of the two-prong plug and a second wire of the second terminal pair of wires is connected to the other of the first prong and the second prong of the two-prong plug;
wherein the two-prong plug is configured to insert into a first jack and a second jack of the three jack receptacle of the handheld maintenance tool; and
wherein the first prong of the shunt plug is configured to insert into the one-jack receptacle of the two-prong plug and the second prong of the shunt plug is configured to insert into a third jack of the three jack receptacle of the handheld maintenance device, and wherein the shunt plug electrically couples the second prong of the shunt plug and the second prong of the two-prong plug when the shunt plug is inserted and coupled to the two-prong plug and handheld maintenance tool.

21. The portable device assembly of claim 20, wherein the handheld maintenance tool includes a processor that is programmed to:

measure a voltage on the two-wire communication line;
determine that the field device requires a power voltage to execute a function based on the measured voltage;
display an indicator to a user that the field device requires the power voltage to execute the function; and
prompt the user to insert the shunt plug.

22. The portable device assembly of claim 21, wherein the processor of the handheld maintenance tool is further programmed to:
display an indicator that the function that requires power is complete; and
display an indicator to prompt the user to manually decouple the shunt plug from the two-prong plug and the handheld maintenance device.

23. The portable device assembly of claim 20, wherein the processor of the handheld maintenance tool is configured to apply a DC voltage to the third jack of the handheld maintenance tool when the handheld maintenance tool has ability to supply power.

24. The portable device assembly of claim 23, wherein the handheld maintenance tool includes a software module programmed to detect an absence of a load between the first and second jacks of the handheld maintenance tool.

25. The portable device assembly of claim 24, wherein the software module of the handheld maintenance device is programmed to open a power connection to the third jack of the handheld maintenance tool after detecting the absence of the load between the first and second jacks.

26. The portable device assembly of claim 25, wherein the software module of the handheld maintenance device is programmed to detect a manual reset, wherein the manual reset includes an open connection to the third jack.

27. The portable device assembly of claim 20, wherein the circuit of the shunt plug includes a diode for blocking a reverse current to the handheld maintenance tool.

28. The portable device assembly of claim 20, wherein the circuit of the shunt plug includes a fuse for disconnecting a DC voltage across the two-wire line when a threshold current is exceeded.

* * * * *